United States Patent [19]
Yamaguchi

[11] Patent Number: 5,828,112
[45] Date of Patent: Oct. 27, 1998

[54] SEMICONDUCTOR DEVICE INCORPORATING AN OUTPUT ELEMENT HAVING A CURRENT-DETECTING SECTION

[75] Inventor: Yoshihiro Yamaguchi, Urawa, Japan

[73] Assignee: Kabushiki Kaisha Toshiba, Kawasaki, Japan

[21] Appl. No.: 715,093

[22] Filed: Sep. 17, 1996

[30] Foreign Application Priority Data

Sep. 18, 1995 [JP] Japan ..................................... 7-238333

[51] Int. Cl.$^6$ ........................... H01L 29/76; H01L 29/94; H01L 31/062; H01L 31/113
[52] U.S. Cl. ........................... 257/378; 257/337; 257/343; 257/350
[58] Field of Search ..................... 257/337, 343, 257/350, 378

[56] References Cited

U.S. PATENT DOCUMENTS

| | | |
|---|---|---|
| 4,654,568 | 3/1987 | Mansmann . |
| 4,994,904 | 2/1991 | Nakagawa et al. . |
| 5,373,436 | 12/1994 | Yamaguchi et al. . |
| 5,616,970 | 4/1997 | Dittrich ..................................... 307/126 |

*Primary Examiner*—Ngân V. Ngô
*Attorney, Agent, or Firm*—Oblon, Spivak, McClelland, Maier & Neustadt, P.C.

[57] ABSTRACT

A semiconductor device having an output element which comprises an IGBT, a diode connected to the IGBT in inverse-parallel, and a voltage-detecting section. The voltage-detecting section comprises a MOSFET and an electrode. The MOSFET is connected to the diode, for generating a voltage proportional to the cathode voltage of the diode. The electrode is provided to detect the voltage generated by the MOSFET. The current flowing in the IGBT can be determined from the voltage detected by the electrode. It is therefore possible to monitor the current flowing through the output element, without increasing the power consumption of the semiconductor device.

6 Claims, 6 Drawing Sheets

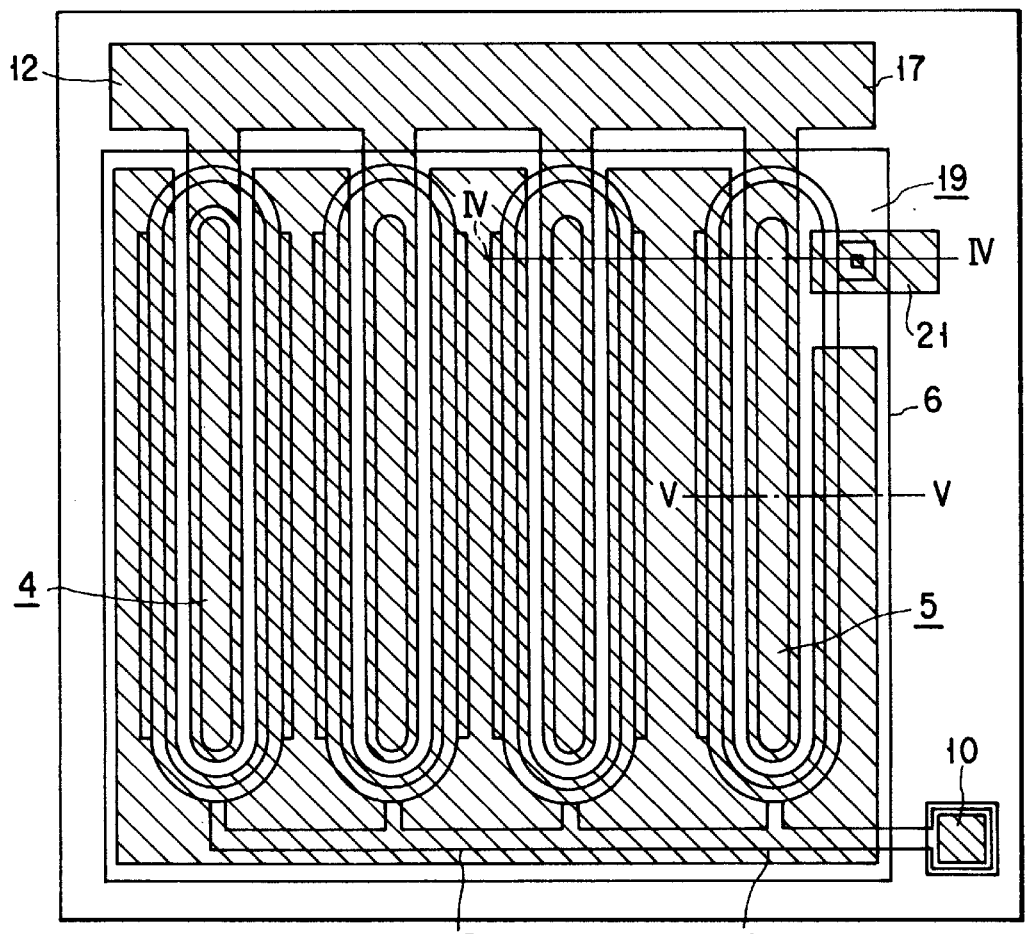
F I G. 3

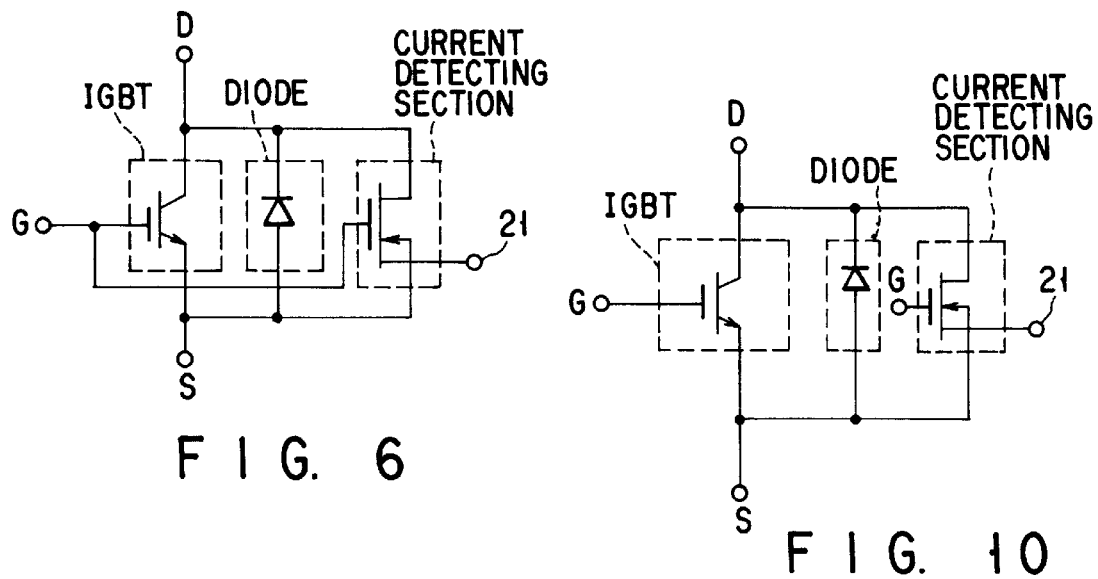
FIG. 6
FIG. 10
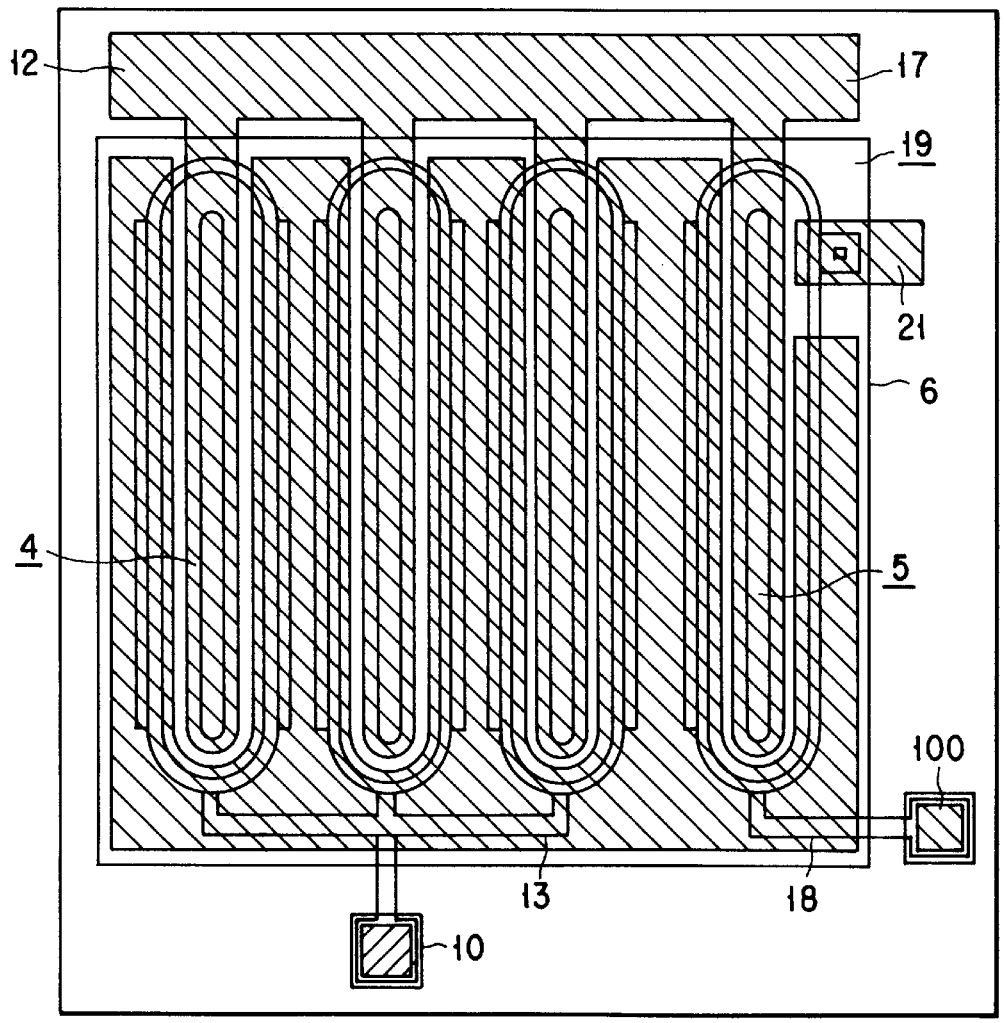
FIG. 9

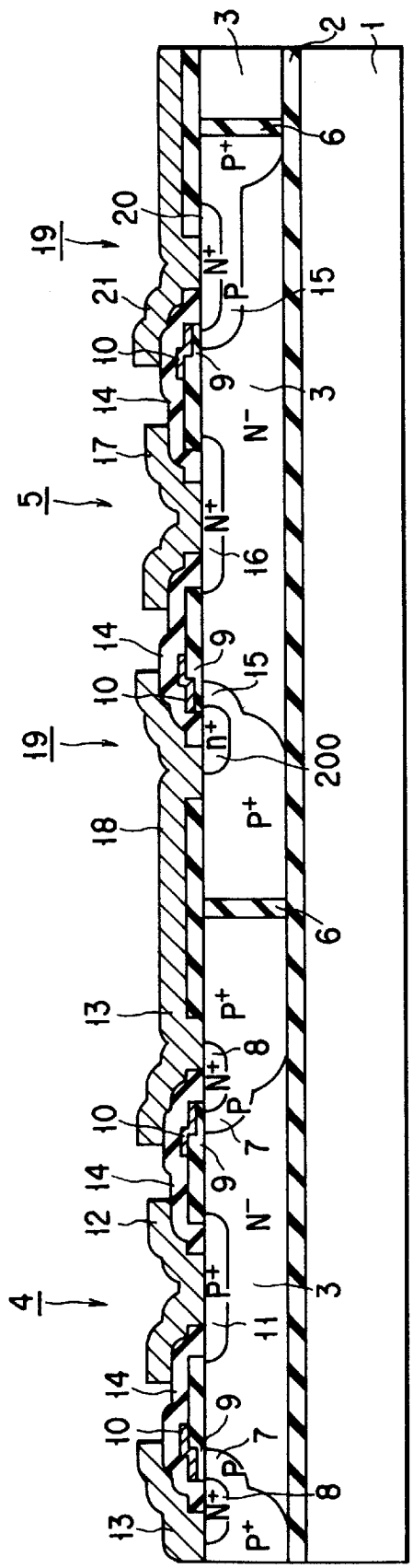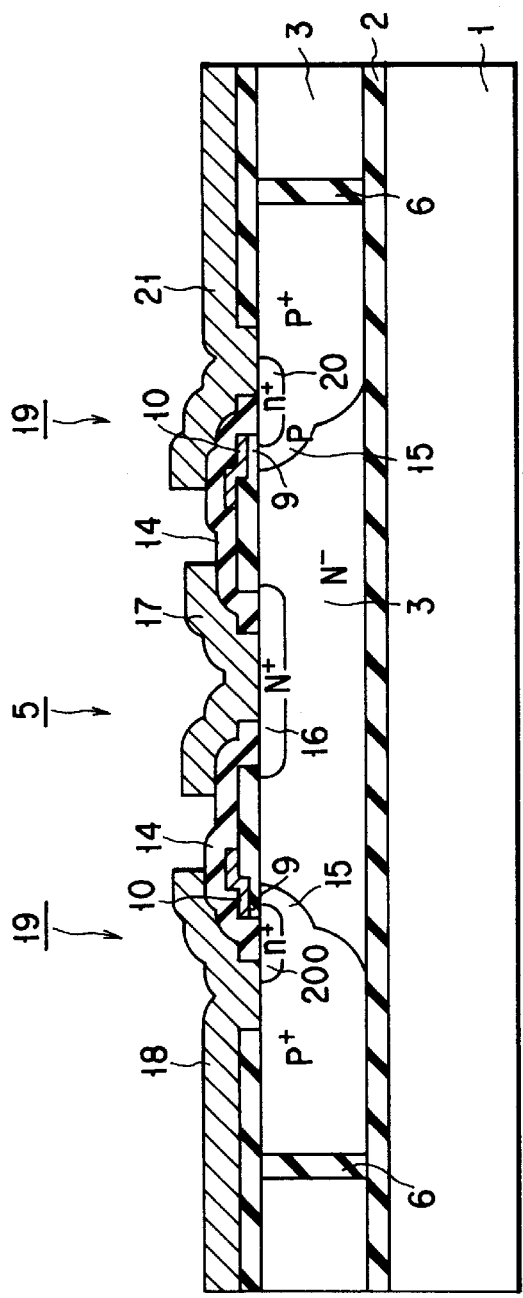
FIG. 7
FIG. 8

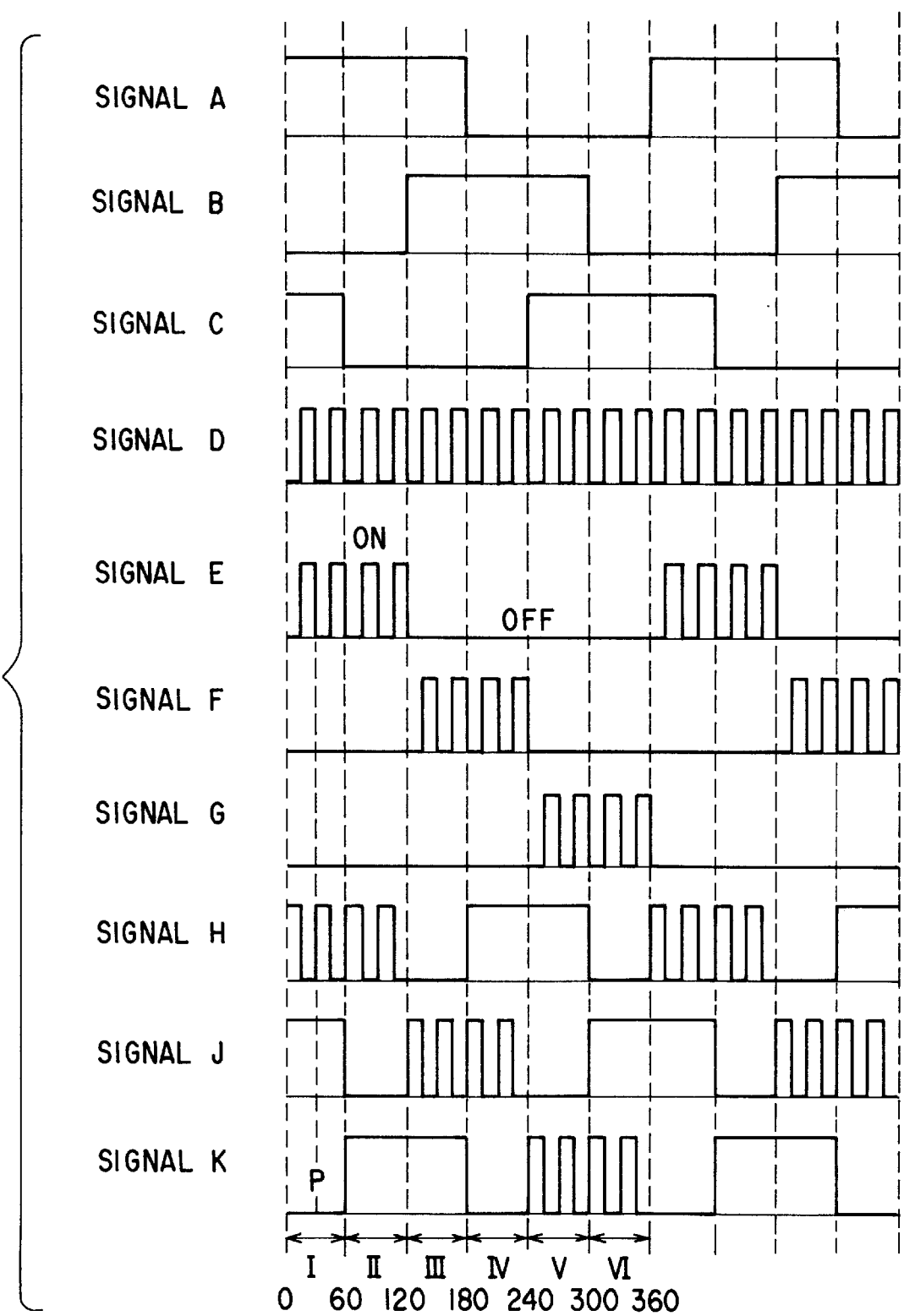
F I G. 12

SEMICONDUCTOR DEVICE INCORPORATING AN OUTPUT ELEMENT HAVING A CURRENT-DETECTING SECTION

BACKGROUND OF THE INVENTION

1. Field of the Invention

The present invention relates to a semiconductor device which incorporates an output element having a current-detecting section provided in a SOI (Silicon on Insulator) substrate.

2. Description of the Related Art

In the field of power electronics there are used various power-converting devices. For example, an inverter is used to drive a DC motor. An inverter incorporates an output element. The current flowing through the output element is detected. If the current is found excessively large, measures are taken to prevent to breakdown of the output element. The output element used in this instance may comprise a MOS-FET (Metal Oxide Semiconductor Field-Effect Transistor), an IGBT (Insulated Gate Bipolar Transistor), or the like.

FIG. 1 is a circuit diagram showing a conventional output element which comprises an IGBT, a diode and a current-detecting section M. The current-detecting section M is connected to the IGBT. The section M can certainly detect the current flowing the IGBT, but cannot detect the current flowing through the diode.

To detect not only the current flowing through the IGBT but also the current flowing through the diode, a resistor R may be provided in the output element as shown in FIG. 2. In this case, the resistor R is connected in series to both the IGBT and the diode. The voltage drop caused by the current flowing through the resistor R is detected, thereby detecting the currents flowing through the IGBT and the diode. The use of the resistor R, however, result in some problems. First, the power consumption of the output element increases. Second, it is difficult to manufacture the output element in the form of an integrated circuit. Third, the output element cannot serve to detect the reflux current which flows through an inverter.

SUMMARY OF THE INVENTION

Accordingly, an object of the present invention is to provide a semiconductor device incorporating a diode, in which the currents flowing in the diode can be monitored without causing an increase in power consumption.

Another object of the present invention is to provide a semiconductor device incorporating a diode, in which the currents flowing in the diode can be monitored without using a resistor.

According to a first aspect of the present invention, there is provided a semiconductor device comprising an IGBT (insulated gate bipolar transistor); a diode connected to the IGBT in inverse-parallel; and a current-detecting section comprising a MOSFET (metal oxide semiconductor field effect transistor) connected to the diode to generate a voltage proportional to a cathode voltage of the diode, and an electrode for detecting a voltage generated by the MOSFET.

The above semiconductor device may further comprising means for determining a current flowing through the IGBT from the voltage detected at the electrode. A source and a drain of the IGBT are connected to an anode and a cathode of the diode, respectively. A gate of the IGBT may be connected to a gate of the MOSFET.

According to a second aspect of the present invention, there is provided a semiconductor device comprising a substrate; an insulating film provided on the substrate; an IGBT (insulated gate bipolar transistor) provided on the insulating film; a diode provided on the insulating film, connected to the IGBT in inverse-parallel and comprising a cathode layer of a conductivity type and a anode layer of a conductivity type, which are selectively formed in the diode; a voltage-detecting section comprising a voltage-detecting terminal layer of a conductivity type provided on a part of the anode layer, a voltage-detecting electrode provided on the voltage-detecting terminal layer, an another insulating film provided on the anode layer, and a gate electrode provided on the another insulating film; and means for determining a current flowing through the IGBT, from a voltage detected by the voltage-detecting section.

In the above semiconductor device, the IGBT may be replaced with MOSFET, GTO (Gate Turn-Off Thyristor), bipolar transistor, or the like.

According to a third aspect of the present invention, there is provided an inverter device comprising a plurality of output elements constituting a bridge circuit; and a driving circuit for supplying two drive signals to upper- and lower-stage output elements of the bridge circuit, respectively, the two drive signals being opposite in phase, wherein at least one of the upper- and lower-stage output elements comprises an IGBT (insulated gate bipolar transistor), a diode connected to the IGBT in inverse-parallel, and a detecting section comprising a MOSFET (metal oxide semiconductor field effect transistor) connected to the diode to generate a voltage proportional to a cathode voltage of the diode, and an electrode for detecting the voltage generated by the MOSFET.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 3 is a plan view of a semiconductor device according to a first embodiment of the present invention;

FIG. 6 is a circuit diagram of the semiconductor device shown in FIG. 3;

FIG. 7 is a sectional view of a semiconductor device according to a second embodiment of the present invention;

FIG. 8 is another sectional view of the second embodiment of the present invention;

FIG. 9 is a plan view of a semiconductor device according to a third embodiment of the present invention;

FIG. 10 is a circuit diagram of the semiconductor device shown in FIG. 9;

FIG. 12 is a timing chart explaining the operation of the inverter shown in FIG. 11.

DETAILED DESCRIPTION OF THE PREFERRED EMBODIMENTS

To facilitate the understanding of the present invention, the idea underlying the present invention will be described briefly, before explaining the embodiments of the present invention.

The semiconductor device according to the present invention comprises an IGBT (alternately, a transistor of any other type or a thyristor), a diode connected to the IGBT in inverse-parallel, and a voltage-detecting section having a MOSFET connected to the diode. The MOSFET comprises a gate insulating film, a gate electrode, a current-detecting terminal layer of a conductivity type, a cathode layer of a conductivity type, and an anode layer of a conductivity type, for example.

When the MOSFET is turned on, a voltage proportional to the cathode voltage of the diode flows to the current-detecting terminal layer. This is because the current-detecting terminal layer is connected by the channel to the cathode layer.

Since the diode is connected to the IGBT in inverse-parallel, the current flowing in the IGBT can be indirectly monitored by detecting the voltage proportional to the cathode voltage of the diode, without connecting a resistor in series to the IGBT. Hence, the current flowing in the IGBT can be monitored, without increasing the power consumption.

The embodiments of the present invention will now be described in detail.

(First Embodiment)

Figure 1:
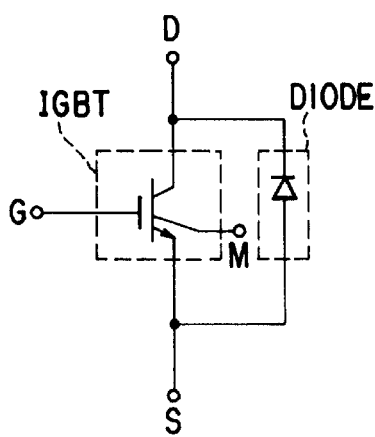
FIG. 1 is a circuit diagram showing a conventional semiconductor device.
Figure 2:
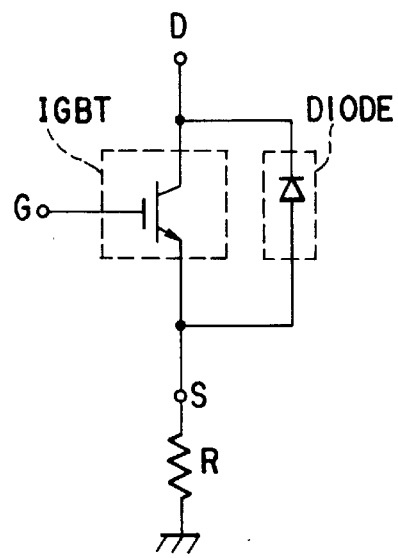
FIG. 2 is a circuit diagram illustrating another conventional semiconductor device.
Figure 4:
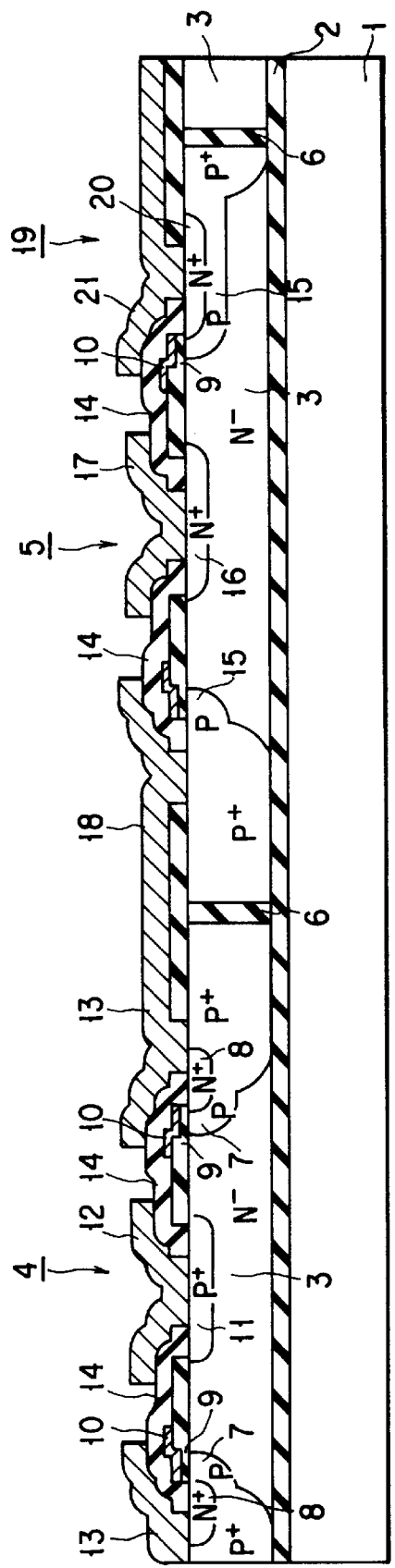
FIG. 4 is a sectional view taken along line IV—IV in FIG. 3.
Figure 5:
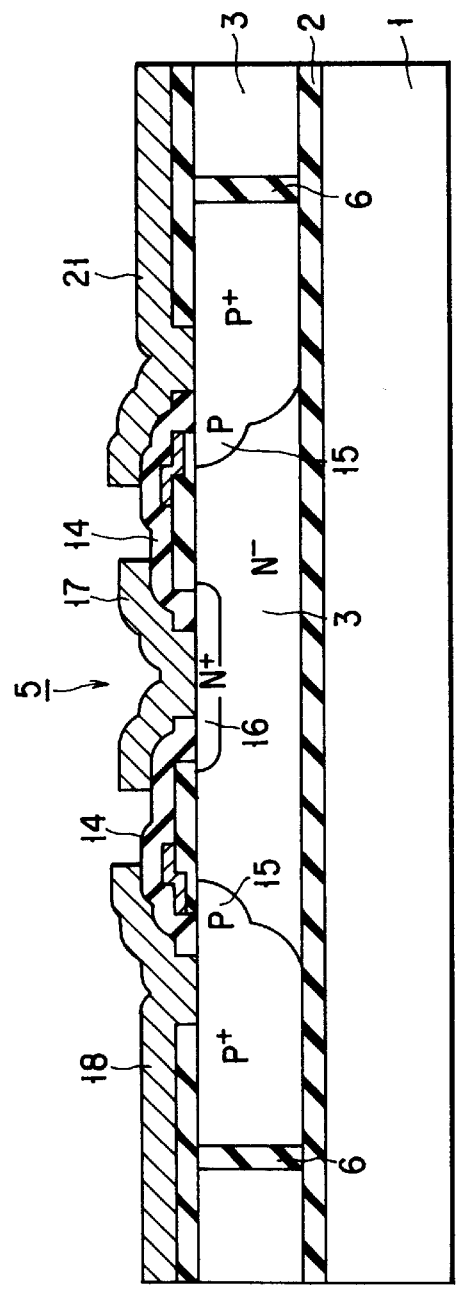
FIG. 5 is a sectional view taken along line V—V in FIG. 3.

FIG. 3 is a plan view of a semiconductor device according to the first embodiment of the present invention. FIG. 4 is sectional views taken along line IV—IV in FIG. 3, illustrating the specific structure of an output element, which characterizes the first embodiment. FIG. 5 is a sectional view taken along line V—V, both shown in FIG. 3, showing the structure of a conventional output element. FIG. 6 is an equivalent circuit diagram of the semiconductor device shown in FIG. 3.

As shown in FIG. 4, the semiconductor device comprises a silicon substrate 1. A silicon oxide film 2 (an insulating film) is formed on the silicon substrate 1. Provided on the film 2 is a n-type silicon film 3 (SOI semiconductor film) which has a low impurity concentration. The silicon substrate 1, silicon oxide film 2 and n-type silicon film 3 constitute a SOI substrate.

The n-type silicon film 3 has trenches which reach the silicon oxide film 2. The trenches are filled is insulating film 6, dividing the film 3 into an IGBT region 4 and a diode region 5.

A p-type base layer 7 is selectively formed in the surface of that part of the n-type silicon film 3 which belongs to the IGBT region 4. The p-type base layer 7 consists of a thin p-type diffusion layer and a thick p-type diffusion layer having a high impurity concentration.

A n-type source layer 8 having a high impurity concentration is selectively formed in the surface of the p-type base layer 7. A gate insulating film 9 is formed on that part of the p-type base layer 7 which is located between the n-type silicon film 3 and the n-type source layer 8. A gate electrode 10 is mounted on the gate insulating film 9.

A p-type drain layer 11 having a high impurity concentration is selectively formed in the surface of the n-type silicon film 3 and spaced apart from the p-base layer 7. A drain electrode 12 is mounted on the p-type drain layer 11. A source electrode 13 is mounted on the n-type source layer 8, so that the n-type source layer 8 and the p-type base layer 7 may be short-circuited to each other. An inter-layer insulating film 14 is formed as shown in FIG. 4.

A p-type anode layer 15 is formed in the surface of that part of the n-type silicon film 3, which belongs to the diode region 5. The p-type anode layer 7 consists of a thin p-type diffusion layer and a thick p-type diffusion layer having a high impurity concentration. A n-type cathode layer 16 having a high impurity concentration is selectively formed in the surface of the n-type silicon film 3. A cathode electrode 17 is mounted on the n-type cathode layer 16, and an anode electrode 18 on the p-type anode layer 15. The anode electrode 18 is connected to the source electrode 13 as is illustrated in FIG. 4. The p-type anode layer 15, n-type cathode layer 16, cathode electrode 17 and anode electrode 18 constitute a diode.

In the present embodiment, a current-detecting section 19 is formed in the diode region 5 in which the diode is formed. More specifically, as shown in FIG. 4, a n-type, current-detecting terminal 20 having a high impurity concentration is selectively formed in the surface of the p-type anode layer 15, and a current-detecting electrode 21 is mounted on the layer 20.

Similar to the structure in the IGBT region 4, a gate insulating film 9 is formed on that part of the p-type anode layer 15 which is located between the n-type silicon film 3 and the n-type, current-detecting terminal layer 20, and a gate electrode 10 is mounted on the gate insulating film 9. The gate electrode 10 is electrically connected to the gate electrode 10 provided in the IGBT region 4.

When a positive voltage is applied to the gate electrode 10, a voltage proportional to the cathode voltage of the diode is applied to the n-type, current-detecting terminal layer 20. This is because the current-detecting terminal layer 20 is connected to the n-type cathode layer 16 by a n-type channel.

Since the diode is connected to the IGBT in inverse-parallel, the current flowing in the IGBT can be indirectly monitored by detecting the voltage by means of the current-detecting electrode 21 without connecting a resistor in series to the IGBT. The current can be monitored, without increasing the power consumption.

(Second Embodiment)

FIGS. 7 and 8 are sectional views of a semiconductor device according to the second embodiment of the present invention. These figures are similar to FIGS. 4 and 5, respectively.

The second embodiment differs from the first embodiment in that a n-type layer 200 (i.e., a source layer) separated from a n-type, current-detecting terminal layer is formed in another p-type anode layer 15 of the diode region 5, thereby forming a MOSFET section. The second embodiment achieves the same advantage as the first embodiment. In addition, an ON-current flows in the MOSFET section, too, decreasing the ON-voltage, whereby the second embodiment has an improved ON-characteristic.

(Third Embodiment)

FIG. 9 is a plan view of a semiconductor device according to the third embodiment of the present invention, and FIG. 10 is a circuit diagram of the third embodiment.

The third embodiment differs from the first embodiment in that the gate electrodes 10 provided in the IGBT region 4 and the diode region 5 (i.e., the current-detecting section 19) are isolated from each other.

The third embodiment attains the same advantage as the first embodiment. Furthermore, since the different voltages can be applied to the gate electrodes of the IGBT and the current-detecting section 19, each of the gate electrodes can be applied with a voltage at an appropriate timing. Accordingly, the setting of time for monitoring current can be freely carried out. Specifically, the current can be monitored at all times if a DC voltage is applied to the gate electrode 100 of the current-detecting section 19, for example.

(Fourth Embodiment)

Figure 11:
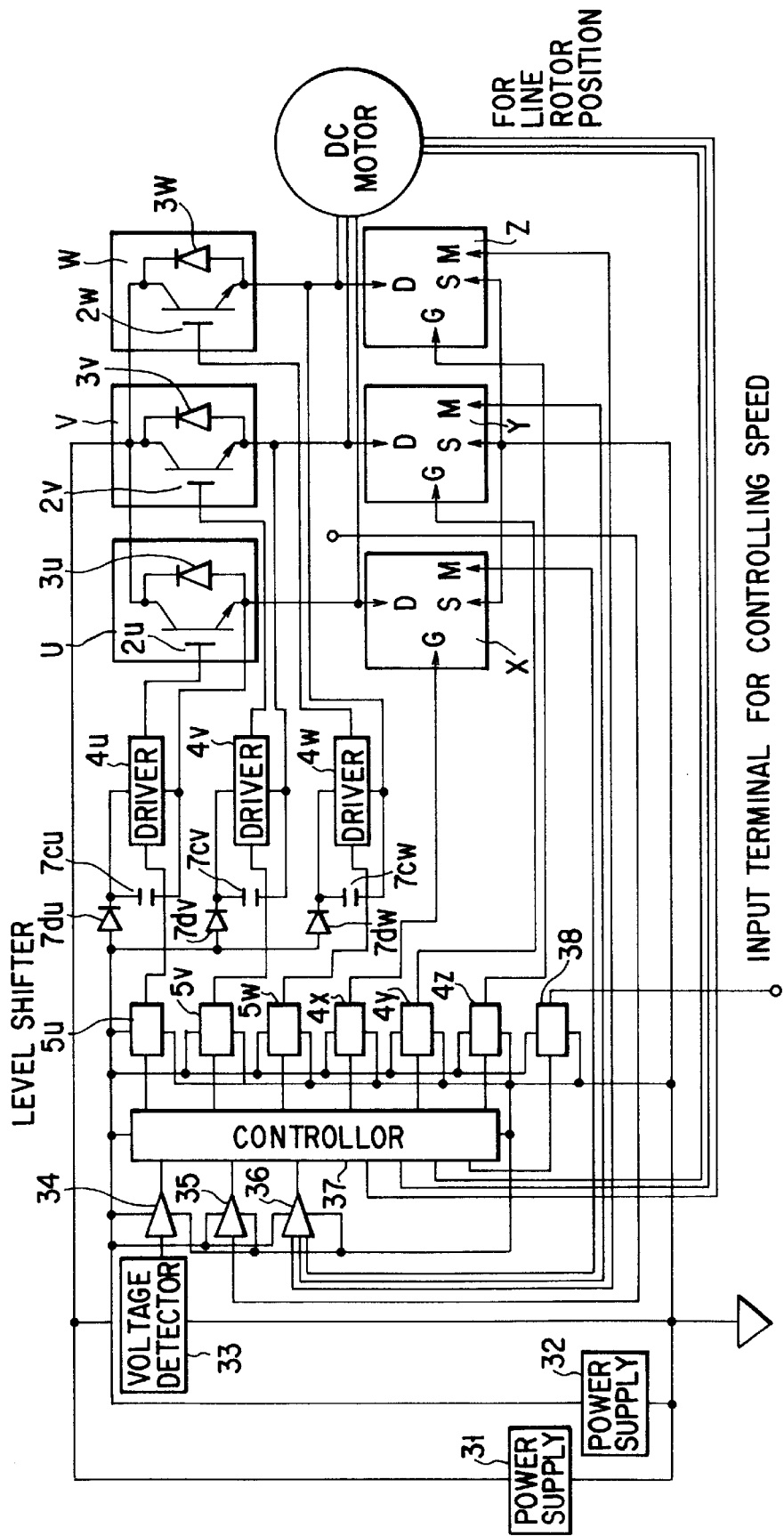
FIG. 11 is a circuit diagram of the semiconductor device, i.e., an inverter, which is a fourth embodiment of the present invention.

FIG. 11 is a circuit diagram of the semiconductor device according to the fourth embodiment of the present invention. More correctly, this device is an inverter which has an output element with an IGBT and which is designed to drive a DC motor.

The inverter is characterized by upper-stage output sections (output elements) X, Y and Z each having a current-detecting section of the type illustrated in FIG. 6. The lower-stage output sections (output elements) U, V and W which are of the conventional type. Nonetheless, the output sections U, V and W may be replaced with those identical to the output sections X, Y and Z.

The three IGBTs $2u$, $2v$ and $2w$ incorporated in the upper-stage output sections U, V and W, the three IGBTs (not shown) incorporated in the lower-stage output sections X, Y and Z, the three diodes $2u$, $3v$ and $3w$ incorporated in the output sections U, V and W, and the three diodes (not shown) incorporated in the output sections X, Y and Z constitute three-phase inverter.

The inverter comprises, besides the output sections U, V, W, X, Y and Z, a first DC power supply 31, drive circuits $4u$, $4v$ and $4w$, drive circuits $4x$, $4y$ and $4z$, level-shifting circuits $5u$, $5v$ and $5w$, a control circuit 37, a power-supplying circuit, a current protection circuit 36, a heat protection circuit 35, a voltage protection circuit 34, a voltage-detecting circuit 33, a second DC power supply 32, and a pulse width modulation (PWM) circuit 38.

The drive circuits $4u$, $4v$ and $4w$ are provided to drive the upper-stage output sections U, V and W. The drive circuits $4x$, $4y$ and $4z$ are used to drive the lower-stage output sections X, Y and Z. The level-shifting circuits $5u$, $5v$ and $5w$ are designed to supply control signals to the drive circuits $4u$, $4v$ and $4w$. The control circuit 37 supplies control signals to the drive circuits $4x$, $4y$ and $4z$ and also to the level-shifting circuits $5u$, $5v$ and $5w$. The power-supplying circuit has diodes $7du$ to $7dw$ and capacitors $7cu$ to $7cw$, for supplying power to the drive circuits $4u$, $4v$ and $4w$. The current protection circuit 36 comprises a circuit for detecting an excessive current and a circuit for stopping the supply of drive signals. The heat protection circuit 35 comprises a circuit for detecting an excessive heat and a circuit for stopping the supply of control signals. The voltage protection circuit 34 comprises a circuit for detecting an excessive voltage and a circuit for stopping the supply of drive signals. The voltage-detecting circuit 33 is designed to detect the voltage applied to the inverter. The second DC power supply 32 is provided to supply power to the drive circuits $4u$ to $4z$, the protection circuits 34, 35 and 36, and the control circuit 37. The PWM circuit 38 is designed to change the width of pulses in accordance with an externally supplied signal and generate pulses having a predetermined frequency.

In operation, the control circuit 37 receives signals which have been generated by the rotor-position detector incorporated in the DC motor and which represent the position of the rotor of the DC motor. In accordance with these signals, the control circuit 37 generates a control signal. The control signal is supplied to the drive circuits $4u$, $4v$ and $4w$ for driving the upper-stage output sections U, V and W. The control signal is supplied also to the drive circuits $4x$, $4y$ and $4z$ for driving the lower-stage output sections X, Y and Z.

When the control signal is supplied to the drive circuits $4u$, $4v$ and $4w$ through the level-shifting circuits $5u$, $5v$ and $5w$, the corresponding output elements are turned on. Currents are thereby supplied to the windings of the DC motor, rotating the rotor of the DC motor. The speed of rotor is controlled by supplying a speed control signal to the input terminal of the PWM circuit 38 such that the pulse width can be shifted and thereby adjusting an average current supplied to the windings of the motor.

FIG. 12 is a timing chart explaining the operation of the inverter shown in FIG. 11. In FIG. 12, A, B and C represent the rotor-position signals, D the output signal of the PWM circuit 38, and E to K are drive signals for driving the IGBTs of the output sections U to Z.

In the present embodiment, the drive signals supplied to the IGBTs of the upper-stage output sections U, V and W are synchronous with the width-modulated pulse signal, whereas the drive signals supplied to the IGBTs of the lower-stage output sections X, Y and Z are opposite in phase to the drive signals supplied to the IGBTs of the upper-stage output sections U, V and W.

The pulses output from the PWM circuit 38 are supplied to the control circuit 37, which generates a width-modulated pulse signal. The width-modulated pulse signal is supplied through the level-shifting circuits $5u$, $5v$ and $5w$ to the drive circuits $4u$, $4v$ and $4w$. The circuits $4u$, $4v$ and $4w$ drive the IGBTs of the upper-stage output sections U, V and W in accordance with the width-modulate pulse signal. In the mean time, a one-pulse PWM drive signal is supplied, along with a pulse signal of a predetermined frequency, from the control circuit 37 to the drive circuits $4x$, $4y$ and $4z$ for driving the lower-stage output sections X, Y and Z.

In the present embodiment, drive signals opposite in phase to the drive signals supplied to the IGBTs of the upper-stage output sections U, V and W are at first supplied to the IGBTs of the lower-stage output sections X, Y and Z, whereby the IGBTs of the lower-stage output sections X, Y and Z are turned on. As a result, the drain potential of the IGBTs of the lower-stage output sections X, Y and Z become almost equal to the ground potential of the inverter. The capacitor $7du$ is thereby charged with the current supplied from the DC power supply 31 through the diode $7ud$ of the power-supplying circuit. The electric charge thus accumulated in the capacitor $7cu$ drives the drive circuit $4u$, turning on the IGBT of the upper-stage output section U. At this time, the current flows to the windings of the DC motor from the DC power supply 31 through the IGBTs of the upper-stage output section U and lower-stage output section Y.

When the pulses supplied from the PWM circuit 38 to the control circuit 37 fall to low level and the IGBT of the upper-stage output section U is turned off, because of the regeneration of the energy accumulated in the windings of the DC motor, a reflux current flows through the IGBT of the lower-stage output section Y and the diode of the lower-stage output section X. At this time, the cathode potential of the diode of the output section X becomes almost equal to the ground potential of the inverter. The capacitor $7cu$ is thereby charged with the current supplied from the DC power supply 31, and power is supplied to the drive circuit $4u$.

Thus, power is supplied to the drive circuits 4u, 4v and 4w as long as the pulses supplied from the PWM circuit 38 to the control circuit 37 remain at high level. The PWM frequency is set at several kilohertz to tens of kilohertz as in any inverter of this type. Power is supplied to the drive circuits 4u to 4w at this frequency. Natural discharging of the capacitors 7uc to 7cw is therefore negligibly small. Hence, the capacitors 7uc to 7cw can be those which have a small capacitance. In addition, power can be supplied to the drive circuits 4u, 4v and 4w to turn on the IGBTs of the upper-stage output sections U, V and W for the first time. This is because drive signals opposite in phase to the drive signals supplied to the IGBTs of the output sections U, V and W are supplied to the IGBTs of the lower-stage output sections X, Y and Z when the IGBTs of the output sections U, V and W are driven by the width-modulated pulse signal generated by the control circuit 37.

In the inverter, the IGBTs are protected against an excessive current, as will be explained below.

During the period I shown in FIG. 12, the IGBT of the upper-stage output section U and the IGBT of the lower-stage output section Y remain turned on. The voltage-detecting section incorporated in the lower-stage output section Y detects the voltage of the diode incorporated in the output section Y. More precisely, the voltage of the diode is detected at the voltage-detecting electrode of the voltage-detecting section. The current flowing the IGBT of the output section Y is determined from the voltage of the diode thus detected.

Accordingly, when the voltage of the diode rises above a predetermined value, the current protection circuit 36 stops the supply of the drive signals or lowers the gate electrode of the IGBT incorporated in the output section Y. The IGBT is thereby turned off and protected from the excessive current. During the periods II, III, IV, V and VI (FIG. 12), the IGBTs are protected from an excessive current in the same way.

In the present embodiment it is possible to detect the reflux current flowing in the lower-stage output sections X, Y and Z, as will be explained below.

At time P in the period I shown in FIG. 12, no drive signals are supplied to the upper-stage output section U, and the supply of drive signals to the lower-stage output section X is started. At time P, the current regenerated in the load (i.e., the windings of the DC motor) connected between the upper-stage output section U and the lower-stage output section Y flows through the diode of the lower-stage output section X provided right below the upper-stage output section U. A drive signal is supplied to the gate of the lower-stage output section X at this time. In the gate of the lower-stage output section X there is generated a voltage which corresponds to the current flowing through the diode of the output section X. The reflux current flowing through the diode is detected from this voltage.

Upon detecting the reflux current whose value is larger than a predetermined value, the inverter is stopped from operating and, thus, protected from the excessive current. During the periods II, III, IV, V and VI (FIG. 12), the inverter is protected from the excessive current in the same way.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

For example, the upper-stage output sections X, Y and Z of the fourth embodiment may each have a current-detecting section of type used in the second or third embodiment, instead of a current-detecting section of the type used in the first embodiment. Furthermore, in the fourth embodiment, not only the lower-stage output section X, Y and Z, but also the upper-stage output section U, V and W may each have a current-detecting section, or only the upper-stage output section U, V and W may each have a current-detecting section. Still further, the IGBTs used in the output sections may be replaced with MOSFETs, GTOs (Gate Turn-Off Thyristors), bipolar transistors, or the like, in each of the embodiment described above.

As has been described, the output sections incorporated in the semiconductor device according to the present invention comprises an element such as an IGBT, a diode connected in inverse-parallel to the element, and a current-detecting section connected to the diode and having a current-detecting terminal layer of a conductivity type. A voltage proportional to the cathode voltage of the diode is applied to the voltage-detecting terminal layer. Hence, the current flowing through the output section can be monitored by detecting the voltage applied to the terminal layer, without using a resistor as is required in the conventional output section and, thus, without increasing the power consumption of the semiconductor device.

Moreover, since no resistor needs to be connected to the output section to detect the current flowing through the output section, the semiconductor device can be made smaller than otherwise. Accordingly, the integration of the semiconductor device can be easily carried out.

In case of applying the output element according to the present invention to an inverter, not only the current flowing through each output section, but also a reflux current can be detected. Further, it is possible to detect a reverse current which flows in the circuit of the fan motor provided in the inverter when a wind is applied to the fan connected to the motor.

What is claimed is:

1. A semiconductor device comprising:

an IGBT (insulated gate bipolar transistor);

a diode connected to said IGBT in inverse-parallel; and a current-detecting section comprising a MOSFET (metal oxide semiconductor field effect transistor) connected to said diode to generate a voltage proportional to a cathode voltage of said diode, and an electrode for detecting a voltage generated by said MOSFET.

2. The device according to claim 1, further comprising means for determining a current flowing through said IGBT from the voltage detected at said electrode.

3. The device according to claim 1, wherein a source and a drain of said IGBT are connected to an anode and a cathode of said diode, respectively.

4. The device according to claim 1, wherein a gate of said IGBT is connected to a gate of said MOSFET.

5. A semiconductor device comprising:

a substrate;

an insulating film provided on said substrate;

an IGBT (insulated gate bipolar transistor) provided on said insulating film;

a diode provided on said insulating film, connected to said IGBT in inverse-parallel and comprising a cathode layer of a conductivity type and a anode layer of a conductivity type, which are selectively formed in said diode;

a voltage-detecting section comprising a voltage-detecting terminal layer of a conductivity type provided on a part of said anode layer, a voltage-detecting electrode provided on said voltage-detecting terminal layer, an another insulating film provided on said anode layer, and a gate electrode provided on said another insulating film; and means for determining a current flowing through the IGBT, from a voltage detected by said voltage-detecting section.

6. An inverter device comprising:

a plurality of output elements constituting a bridge circuit; and a driving circuit for supplying two drive signals to upper- and lower-stage output elements of said bridge circuit, respectively, said two drive signals being opposite in phase, wherein at least one of said upper- and lower-stage output elements comprises:

an IGBT (insulated gate bipolar transistor), a diode connected to said IGBT in inverse-parallel, and a detecting section comprising a MOSFET (metal oxide semiconductor field effect transistor) connected to the diode to generate a voltage proportional to a cathode voltage of the diode, and an electrode for detecting the voltage generated by said MOSFET.

* * * * *